(12) United States Patent
Moore et al.

(10) Patent No.: US 7,222,278 B2
(45) Date of Patent: May 22, 2007

(54) PROGRAMMABLE HYSTERESIS FOR BOUNDARY-SCAN TESTING

(75) Inventors: Charles E. Moore, Loveland, CO (US); Xiaoyang Zhang, San Jose, CA (US); Jeffrey R. Rearick, Fort Collins, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 434 days.

(21) Appl. No.: 10/666,770

(22) Filed: Sep. 17, 2003

(65) Prior Publication Data

US 2005/0060624 A1   Mar. 17, 2005

(51) Int. Cl.
*G01R 31/28* (2006.01)
*H03K 5/153* (2006.01)
*H03K 3/00* (2006.01)

(52) U.S. Cl. .................. 714/727; 327/77; 327/205

(58) Field of Classification Search ............ None
See application file for complete search history.

(56) References Cited

U.S. PATENT DOCUMENTS

| | | | | |
|---|---|---|---|---|
| 4,940,907 A | * | 7/1990 | Laude | 327/73 |
| 5,153,462 A | * | 10/1992 | Agrawal et al. | 326/39 |
| 5,264,740 A | * | 11/1993 | Wright | 327/63 |
| 5,508,645 A | * | 4/1996 | Castellucci et al. | 327/77 |
| 5,610,545 A | * | 3/1997 | Jenkins et al. | 327/205 |
| 5,617,050 A | * | 4/1997 | Jenkins et al. | 327/205 |
| 6,982,582 B1 | * | 1/2006 | Cheng | 327/205 |
| 2002/0069386 A1 | | 6/2002 | Neeb | |
| 2003/0083841 A1 | | 5/2003 | Moore | |

FOREIGN PATENT DOCUMENTS

GB   2395284   5/2004

OTHER PUBLICATIONS

IEEE 1149.6: Boundary Scan Standard for Advanced Digital Networks, Eklow et al, Sep.-Oct. 2003, pp. 76-83.*
Advanced I/O Working Group of the Test Technology Standards Committee fo the IEEE Computer Society, "Draft Standard for Boundary-Scan Testing of Advanced Digital Networks", Jun. 4, 2002, IEEE P1149.6:D3.1,110 pages.
IEEE P1149.6:D3.1; Prepared by the Advanced I/O Working Group of the Test Technology Standards Committee of the IEEE Computer Society; Draft Standard for Boundary-Scan Testing of Advanced Digital Networks; Jun. 4, 2002; 13 Pages.

* cited by examiner

Primary Examiner—Phung My Chung (57) ABSTRACT

Disclosed is a Boundary-Scan test receiver for capturing signals during board interconnect testing. The test receiver has a comparator with a first input to receive signals during board interconnect testing, and a second input to receive a reference voltage. A programmable hysteresis circuit is coupled to at least one of the comparator's inputs. The programmable hysteresis circuit may be configured to program a hysteresis voltage and/or a hysteresis delay, both of which help prevent the comparator from integrating signal noise.

20 Claims, 9 Drawing Sheets

PROGRAMMABLE HYSTERESIS FOR BOUNDARY-SCAN TESTING

BACKGROUND

A common way to diagnose interconnect defects (e.g., shorts and opens) in circuit assemblies (e.g., printed circuit boards, Multi-Chip Modules, and Silicon-in-Package devices) is via Boundary-Scan testing. A standard for Boundary-Scan testing is defined in IEEE Standard 1149.1.

As the electronics industry has moved forward with the implementation of AC coupled and differential networks, limitations in the techniques specified by IEEE Std. 1149.1 have become apparent. Specifically, IEEE Std. 1149.1 was designed to address the testing of single-ended, DC coupled networks, with no specific consideration of differential networks and explicit exclusion of AC coupled networks (an AC coupled network features a series capacitor or transformer to block DC current flow along the signal path, thereby allowing only AC signals to pass). A standard that defined how to apply Boundary-Scan techniques to AC coupled networks was therefore needed. To this end, IEEE Std. 1149.6 was developed. IEEE Std. 1149.6 specifies how to apply Boundary-Scan test principles to circuit assemblies comprising AC coupled and/or differential networks.

IEEE Std. 1149.6 is built upon the infrastructure of IEEE Std. 1149.1, but specifies the requirements of additional hardware to enable the creation and detection of signal transitions. These transitions, unlike constant voltage levels, can pass through AC coupling devices, and can thus be used to test the interconnection of components of an AC coupled network on a circuit assembly.

SUMMARY OF THE INVENTION

One aspect of the invention is embodied in a Boundary-Scan test receiver for capturing signals during board interconnect testing. The test receiver comprises a comparator, which in turn comprises a first input to receive said signals during board interconnect testing, and a second input to receive a reference voltage. The test receiver further comprises a programmable hysteresis circuit coupled to at least one of said comparator inputs.

Another aspect of the invention is also embodied in a Boundary-Scan test receiver for capturing signals during board interconnect testing. The test receiver comprises a plurality of comparators, each of which comprises a first input to receive said signals during board interconnect testing, and a second input to receive a reference voltage. The test receiver further comprises a programmable hysteresis circuit coupled to at least one input of each comparator.

Yet another aspect of the invention is embodied in a Boundary-Scan test method. The test method comprises 1) determining at least one operating condition of a board under test, 2) in response to the determined operating condition(s), programming hysteresis circuits of Boundary-Scan test receivers in the board under test, and 3) executing a Boundary-Scan test.

Other embodiments of the invention are also disclosed.

BRIEF DESCRIPTION OF THE DRAWINGS

Illustrative embodiments of the invention are illustrated in the drawings, in which.

DETAILED DESCRIPTION OF THE INVENTION

As indicated above, IEEE Std. 1149.6 specifies the necessary circuitry for detecting the presence of signal transitions during Boundary-Scan testing. IEEE Std. 1149.6 also specifies circuitry and methods for providing a test receiver with a fixed amount of noise rejection such that the test receiver will ignore small amplitude or short duration signal glitches. A fixed amount of noise rejection can be problematic, however, when a component (e.g., an integrated circuit) may be used in different applications and environments, each of which is associated with different levels of noise. As a result, circuitry and methods for providing a test receiver with a programmable amount of noise rejection, thereby enabling a single component to be programmed with different hysteresis levels in different applications, would be useful. Descriptions of various test receivers into which a programmable hysteresis circuit (or circuits) might be incorporated, as well as exemplary configurations of hysteresis circuits (and a method of using same) are therefore disclosed below.

Figure 1:
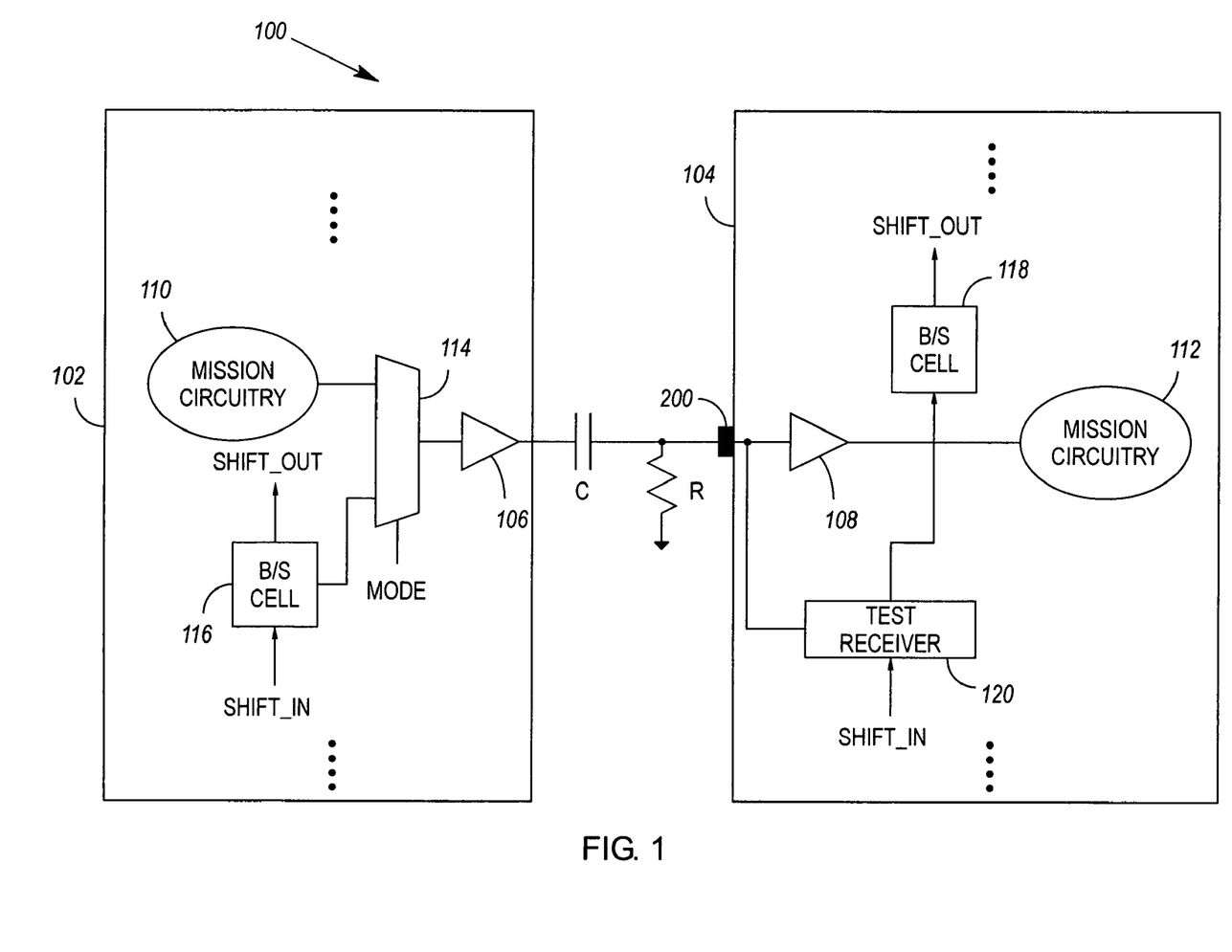
FIG. 1 illustrates an exemplary circuit assembly comprising an AC coupled network.

FIG. 1 illustrates an exemplary circuit assembly 100 comprising an AC coupled network. The AC network couples a driver 106 of a first device 102 to a receiver 108 of a second device 104. By way of example, the two devices 102, 104 could be integrated circuits (ICs). The devices 102, 104 might be coupled via an AC network for a variety of reasons, such as their use of incompatible DC signal levels. In the case of incompatible DC signal levels, the receiver 108 of the second device 104 would incorporate a biasing network for the purpose of establishing its own preferred operating point, typically at the midpoint of its logic swing.

The AC coupling of the FIG. 1 circuit assembly 100 comprises a capacitor (C) that is coupled in series with the driver 106 of the first device 102 and the receiver 108 of the second device 104. The AC coupling might further comprise a termination resistor (R).

Although FIG. 1 only illustrates one AC coupling between the devices 102, 104 shown, in practice, the two devices 102, 104 would likely be coupled by a plurality of AC couplings and, quite possibly, a mix of AC and DC couplings.

Because AC couplings will not pass DC voltage levels, the receiver 108 in the second device 104 will see capacitive decay in transmitted signals if the rate of change of the transmitted signals is low compared to the time constant (R*C) of the coupling. Signals must therefore be transmitted at a high enough frequency, and with frequent enough transitions, so as to mitigate signal decay. To this end, the mission circuitry 110 of a transmitting device 102 will typically encode data in such a way that frequent signal transitions are assured, thus "conditioning" the AC coupling for data transfer.

Unfortunately, the transient nature of an AC coupling makes it difficult, if not impossible, to test the coupling using the Boundary-Scan principles set forth in IEEE Std. 1149.1. The 1149.1 standard contemplates the transmission of DC signal levels between drivers 106 and receivers 120. Although the DC signal levels are periodically changed, there is no requirement that the signal levels be changed with any particular frequency.

As a result, the time between signal level changes is typically quite long in comparison to the time constant of an AC coupling. The length of time between signal level changes is due to a combination of factors, including: the frequency of the Boundary-Scan test clock (TCK) being orders of magnitude slower than a device's mission clock frequency, and a need to frequently interrupt the test clock for the processing of test system overhead functions. Since low frequency signals transmitted through an AC coupling tend to decay, conventional Boundary-Scan testing of AC coupled networks is unreliable at best, and often not even practical.

A standard for applying Boundary-Scan techniques to AC coupled and/or differential networks is disclosed in IEEE Std. 1149.6. The standard contemplates the creation of an AC waveform that is propagated between a mission driver 106 and a test receiver 120. The mission driver 106 may be loaded via a Boundary-Scan cell 116 that is multiplexed with mission circuitry 110 via a multiplexer 114. Because of the variability of test clock rates and the amount of data shifting involved, the AC waveform may still be of a low frequency. However, the waveform is constructed such that each test bit sent via the waveform comprises at least two waveform edges—first the intended test bit is sent, followed by the complement of the test bit, followed by the intended test bit again.

Figure 2:
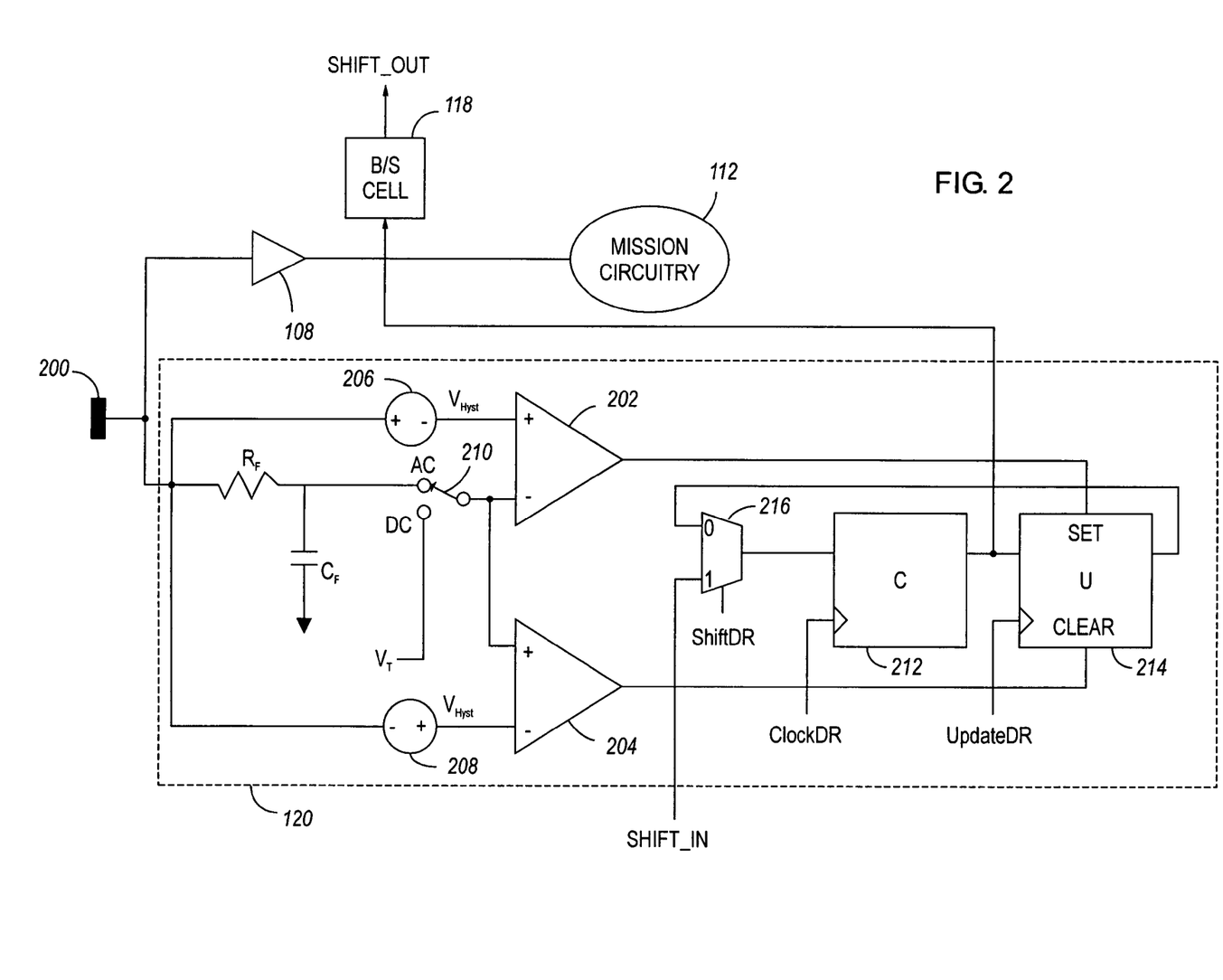
FIG. 2 illustrates an exemplary embodiment of the test receiver shown in FIG. 1.

As illustrated in FIG. 2, the test receiver 120 contemplated by the 1149.6 standard comprises rising and falling edge detectors 202, 204 (e.g., comparators) which are used to "reconstruct" an original waveform from the edges of the waveform that pass through an AC coupling. Thus, even though the DC levels produced by a driver 106 may decay, an "original" waveform may still be reconstructed by the test receiver 120. Boundary-Scan therefore "thinks" it is testing with levels, but in reality, an AC waveform crosses over an AC coupling, and an integrator reconstructs the original waveform from its edge information.

Referring to the FIG. 2 test receiver 120 in more detail, one notices that the receiver 120 comprises two comparators 202, 204. The upper comparator 202 is a leading edge detector that "sets" the flip-flop 214 marked "U". The lower comparator 204 is a falling edge detector that "resets" the "U" flip-flop 214. Thus, an AC waveform seen in differentiated form at pin 200 is reconstructed at the output of the "U" flip-flop 214 (i.e., so long as switch 210 is in its "AC" position). The two voltage sources ($V_{Hyst}$ 206, 208) provide noise immunity that prevents small signal noise from being integrated. Additional noise immunity (i.e., noise immunity from larger signal noise) is provided by a hysteresis delay associated with each comparator 202, 204. The low-pass filter ($R_F/C_F$) holds the recent, average value of the incoming waveform so that the edge detectors 202, 204 can compare this value to the instantaneous value of the incoming waveform. Thus, if a signal edge arrives at pin 200, and then slowly decays, the signal edge will set (or reset) the "U" flip-flop 214. The "U" flip-flop 214 can be thought of as a "hysteretic" memory (or hysteretic test receiver memory) in that it retains the state of the last valid signal level received by the test receiver 120—even after the signal level has decayed and may no longer exist.

During Boundary-Scan testing, the signal levels (i.e., data values) stored in the "U" flip-flop 214 need to be captured and evaluated. If the "U" flip-flop 214 is equated with the Update flip-flop of a conventional Boundary-Scan cell, then its output may be linked to the input of a Capture flip-flop (i.e., the "C" flip-flop 212 in FIG. 2). From there, data may be shifted out of the test receiver 120. Depending on the position of the Capture flip-flop 212 in a Boundary-Scan register, its data may be shifted through other Boundary-Scan cells (e.g., cell 118, as well as other cells connected to SHIFT_OUT).

The Boundary-Scan cell 212, 214 further comprises a multiplexer 216. A first path through the multiplexer links the output of the Update flip-flop 214 to the input of the Capture flip-flop 212. A second path through the multiplexer links the input of the Capture flip-flop 212 to upstream Boundary-Scan cells forming a part of the afore-mentioned Boundary-Scan register (i.e., cells connected to SHIFT_IN). A control signal (ShiftDR) determines which of the two paths is active. If the second path is active (ShiftDR=1), data appearing at SHIFT_IN may be shifted into the Capture flip-flop 212 in sync with the control signal ClockDR, and then loaded into the Update flip-flop 214 (i.e., the hysteretic test receiver memory) in sync with the control signal UpdateDR.

Although the 1149.6 standard discloses the use of a hysteresis voltage and hysteresis delay to minimize the integration of signal noise, the standard only discloses a need for a static voltage and delay. A circuit designer must therefore select a hysteresis voltage and hysteresis delay that are appropriate for a particular set of operating conditions. Too great a voltage or delay, and a signal may not trigger a comparator. Too little a voltage or delay, and signal noise may falsely trigger a comparator.

Operating conditions that effect a designer's choice of a hysteresis voltage and hysteresis delay include the signaling levels of components on a board, as well as the noise level(s) of signal paths that couple the components to one another on the board. Given that 1) it is often desirable to design a component for use on a variety of boards using different signaling levels, and 2) noise levels of signal paths are hard to predict prior to board manufacture, the inventors describe below a number of Boundary-Scan test receivers with programmable hysteresis circuits. With programmable hysteresis circuits, decisions regarding the appropriate hysteresis levels for a board may be delayed until after a board is manufactured (and, as will be explained below, may even be revised as boards are tested).

FIGS. 3–7 illustrate various Boundary-Scan test receivers 320, 420, 520, 620, 700 for capturing signals during board interconnect testing. Each test receiver comprises a number of comparators 202, 204, 202', 204' (which could be one comparator, or a plurality (two or more) of comparators). Each comparator comprises a first input to receive an input signal (e.g., $V_{IN}$, $V_{IN}^+$, or $V_{IN}^-$) during board interconnect testing, and a second input to receive a reference voltage (e.g., $V_{REF}$). In the embodiments shown, a programmable hysteresis circuit 306, 606, 708, 718, 800, 900 is coupled (although not necessarily directly) to at least one input of each comparator in a test receiver. However, this should not be taken as an implication that all of the test receivers of a component need incorporate a programmable hysteresis circuit.

Figure 3:
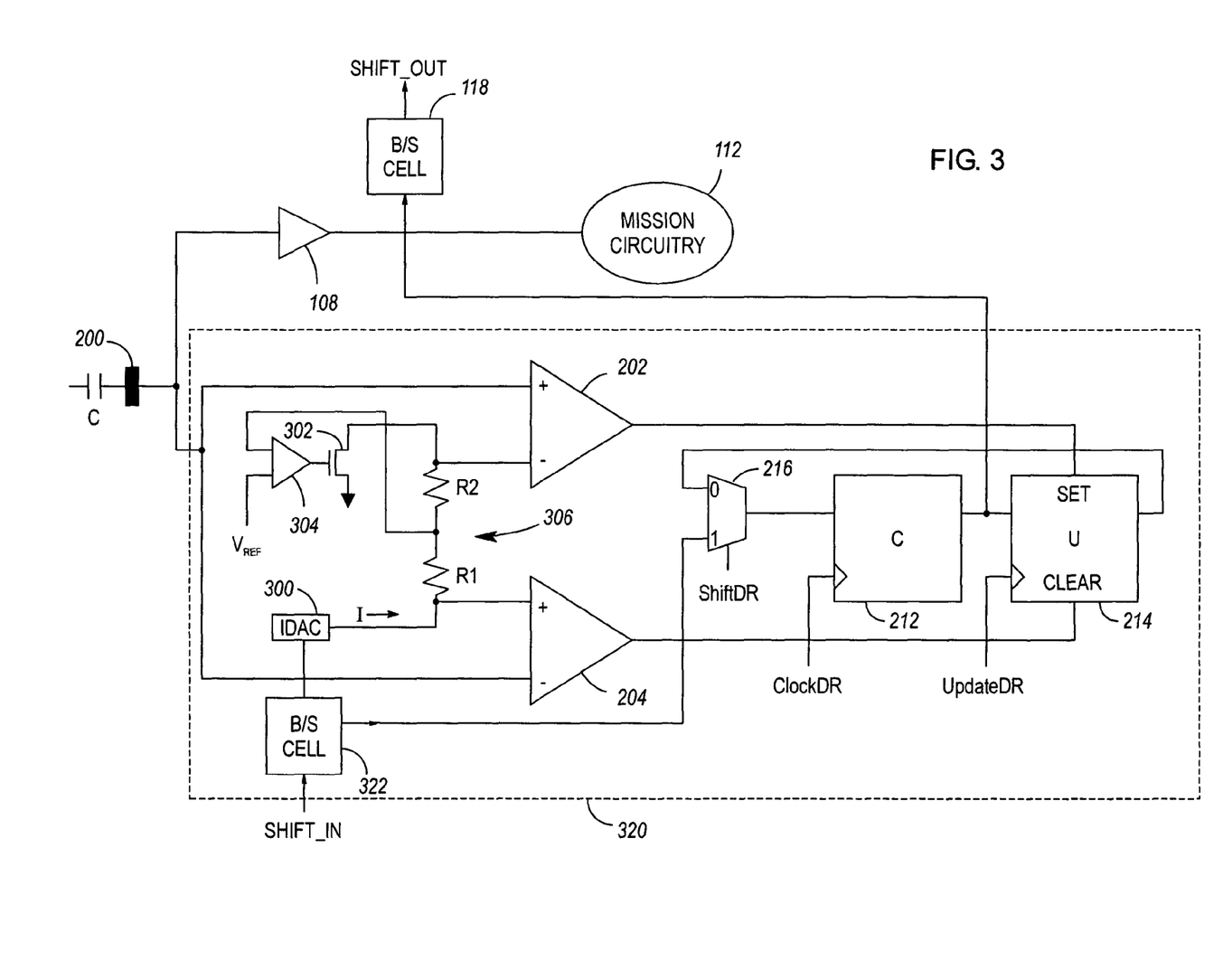
FIGS. 3–6 illustrate various and exemplary test receivers comprising programmable hysteresis voltage generators.

FIG. 3 illustrates a test receiver 320 coupled to receive a single-ended AC signal, $V_{IN}$. In accordance with the 1149.6 standard, $V_{IN}$ is received at a pair of comparators 202, 204, one of which is configured to detect rising edges of $V_{IN}$, and one of which is configured to detect falling edges of $V_{IN}$. The remaining inputs of the comparators 202, 204 are coupled to a programmable hysteresis circuit 306 comprising a programmable hysteresis voltage generator. The voltage generator comprises a voltage divider (resistors R1 & R2) coupled between the reference inputs of the two comparators 202, 204. Note, however, that the voltage divider could also be coupled between the other set of comparator inputs, so long as the range of $V_{IN}$ leaves enough headroom to do so. A current digital-to-analog converter (IDAC 300) drives the voltage divider. As is known in the art, the IDAC may be programmed using any number of bits, as necessary to provide sufficient resolution in the possible values of current I. A current mirror 302, 304 is coupled to the midpoint of the voltage divider to mirror a reference voltage, $V_{REF}$, at the midpoint. As shown, the current mirror may be implemented using an op-amp 304, one input of which is coupled to receive $V_{REF}$, and the other input of which is coupled to the midpoint of the voltage divider. The output of the op-amp 304 may then be coupled to drive the gate of a transistor 302 that is connected between the voltage divider and ground. In this manner, the programmable hysteresis voltage generator adds or substructs hyseresis voltages to the reference voltage $V_{REF}$. If desired, the resistors may be selected such that R1=R2 and the same hysteresis voltage is added (or substracted) to $V_{REF}$. Alternately, R1 and R2 may be chosen to provide different hysteresis voltages for the comparators 202, 204.

Figure 4:
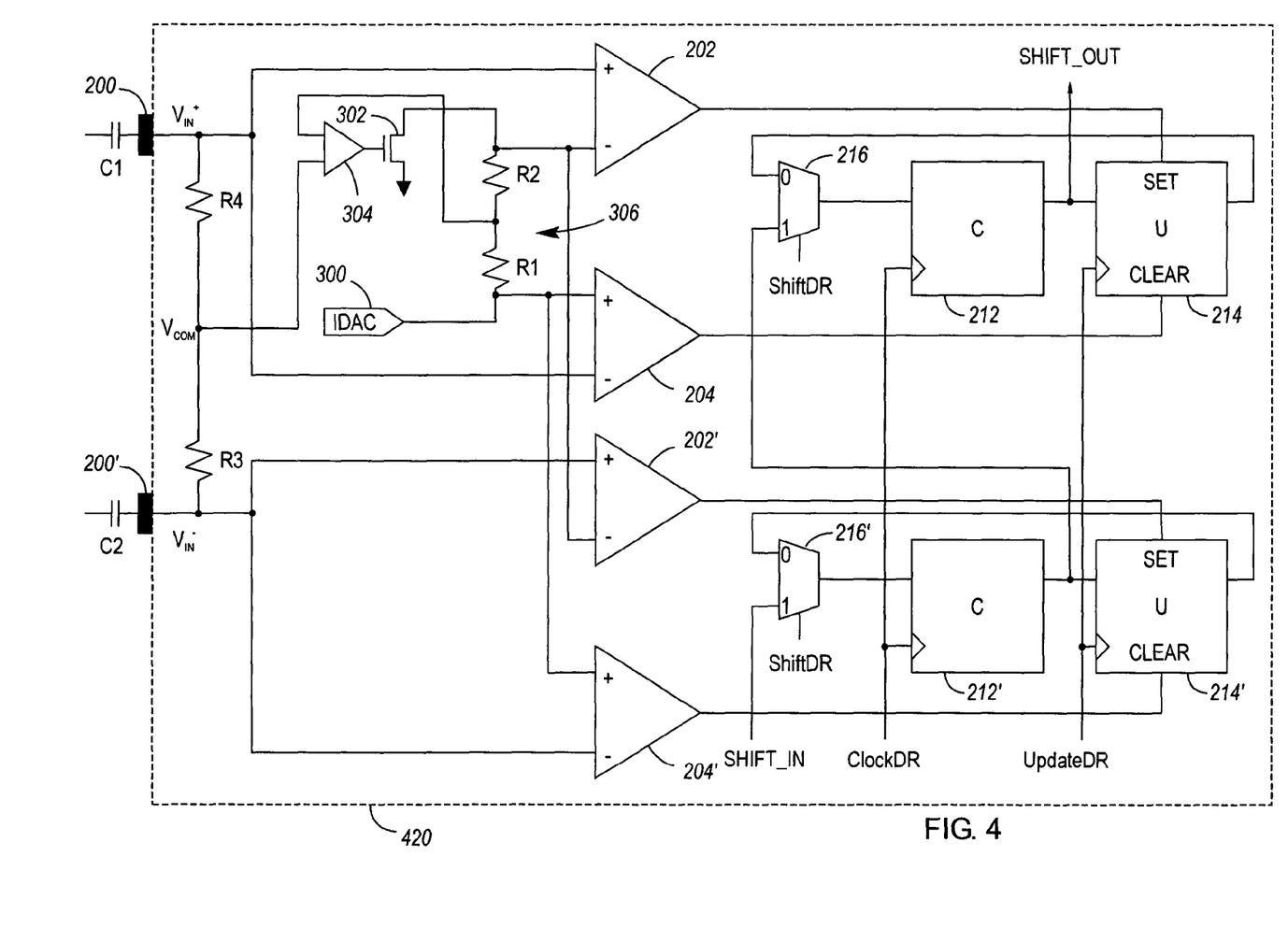
Figure 5:
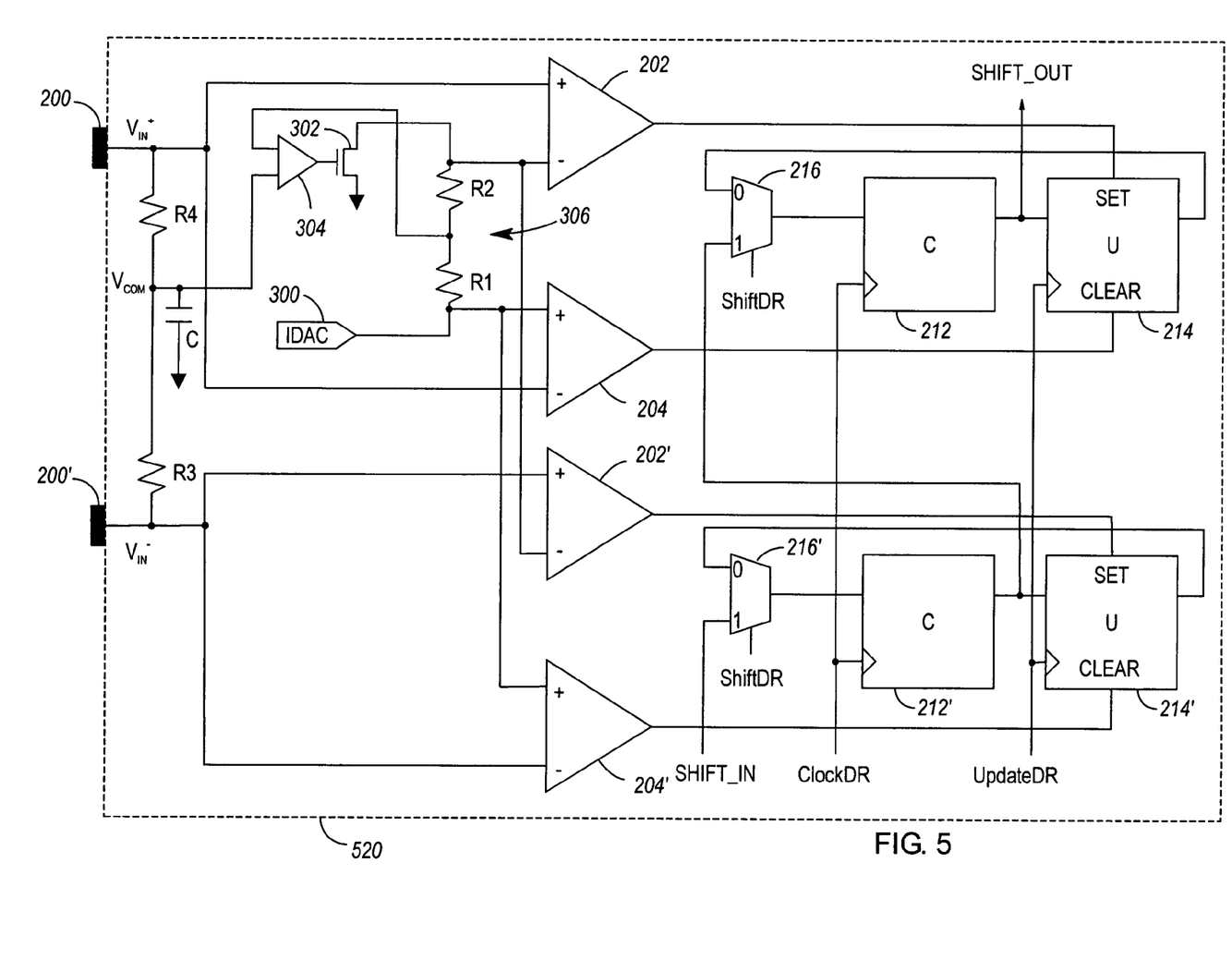

The value of $V_{REF}$ may be variously chosen, as discussed in the 1149.6 standard. In FIGS. 4 & 5, $V_{REF}$ is the common mode voltage ($V_{COM}$) of differential input signals $V_{IN}^+$ and $V_{IN}^-$. In FIG. 4, the differential input signals are AC signals, and $V_{COM}$ is derived from the midpoint of a voltage divider comprising resistors R3 & R4 coupled in series between the differential input signals. In FIG. 5, the differential input signals are DC signals, and $V_{COM}$ is the low-pass filtered difference of the differential input signals (filtered through a network comprising resistors R3 & R4 and capacitor C).

It should be noted that in FIGS. 4 & 5, the same programmable hysteresis voltage generator 306 provides hysteresis voltages to two sets of comparators 202/204, 202'/204': one set of which detects leading and falling edges of $V_{IN}^+$, and the other set of which detects leading and falling edges of $V_{IN}^-$. The same programmable hysteresis circuit could also provide a programmable hysteresis value to other test receivers, to the extent that line loading and physical signal routes allow, and to the extent that the signals share a common reference level. It should also be noted that circuit elements depicted in FIGS. 4 & 5 with primed reference numbers function equivalently to their unprimed counterparts. Thus, components 200', 202', 204', 212', 214' and 216' function equivalently to components 200, 202, 204, 212, 214 and 216.

Figure 6:
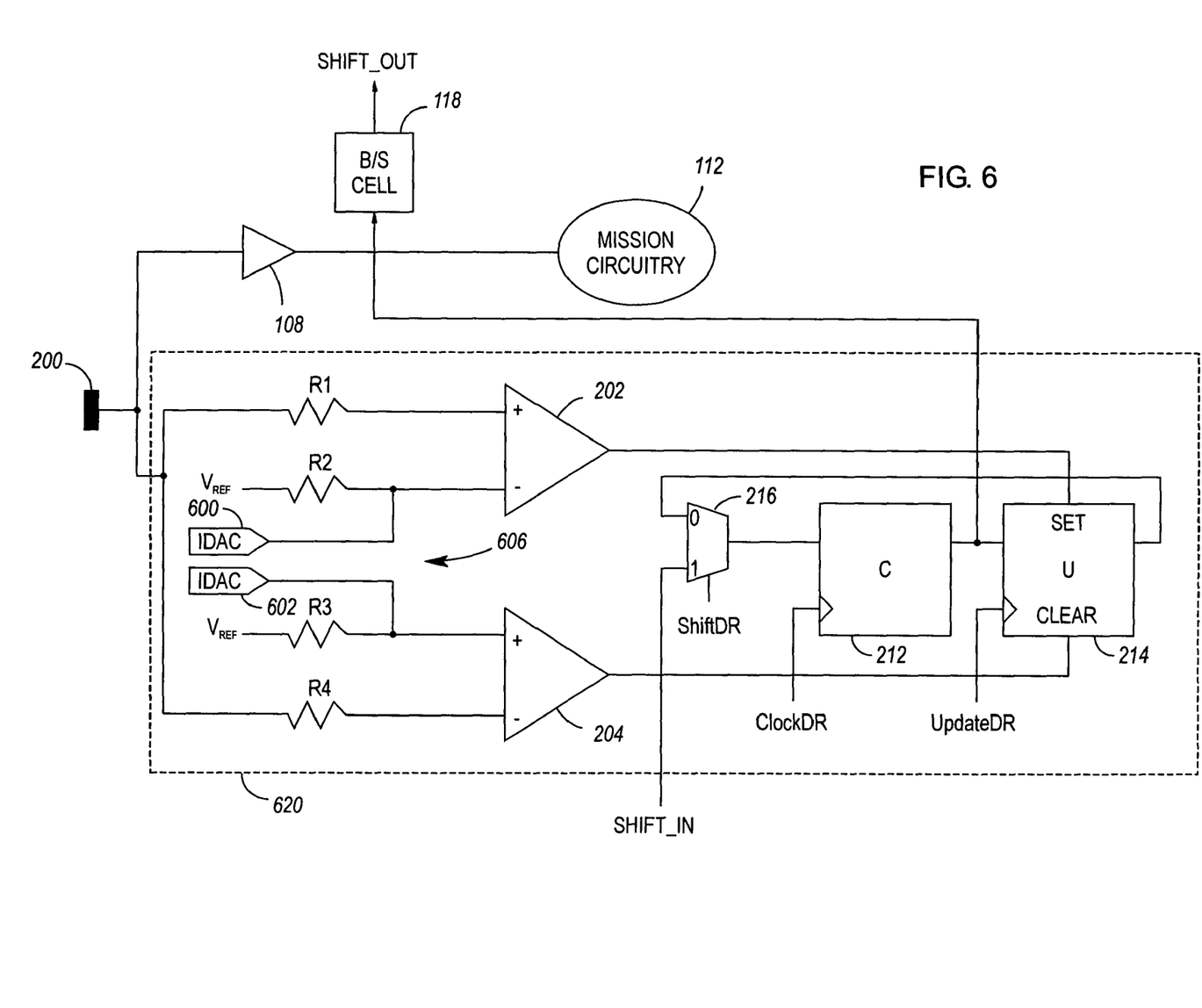

FIG. 6 illustrates an alternate Boundary-Scan test receiver 620 comprising a programmable hysteresis voltage generator 606. The test receiver receives a single-ended signal, $V_{IN}$, at corresponding inputs of a pair of comparators 202, 204. A reference voltage $V_{REF}$, such as the mean of $V_{IN}$, is received at the second input of each comparator. The programmable hysteresis voltage generator 606 comprises a pair of IDACs 600, 602 that sink current from either the input voltage or reference voltage input of one of the comparators 202, 204. The IDACs may be programmed similarly or differently and, if programmed similarly, may even be replaced with a single IDAC. For the comparator 202 that detects leading edges of $V_{IN}$, the IDAC 600 is coupled to the comparator's reference input, thereby generating a hysteresis voltage across resistor R2 and sinking current from $V_{REF}$. For the comparator 202 that detects trailing edges of $V_{IN}$, the IDAC 602 is coupled to the comparator's signal input, thereby sinking current from $V_{IN}$ and generating a hysteresis voltage across resistor R3.

Figure 7:
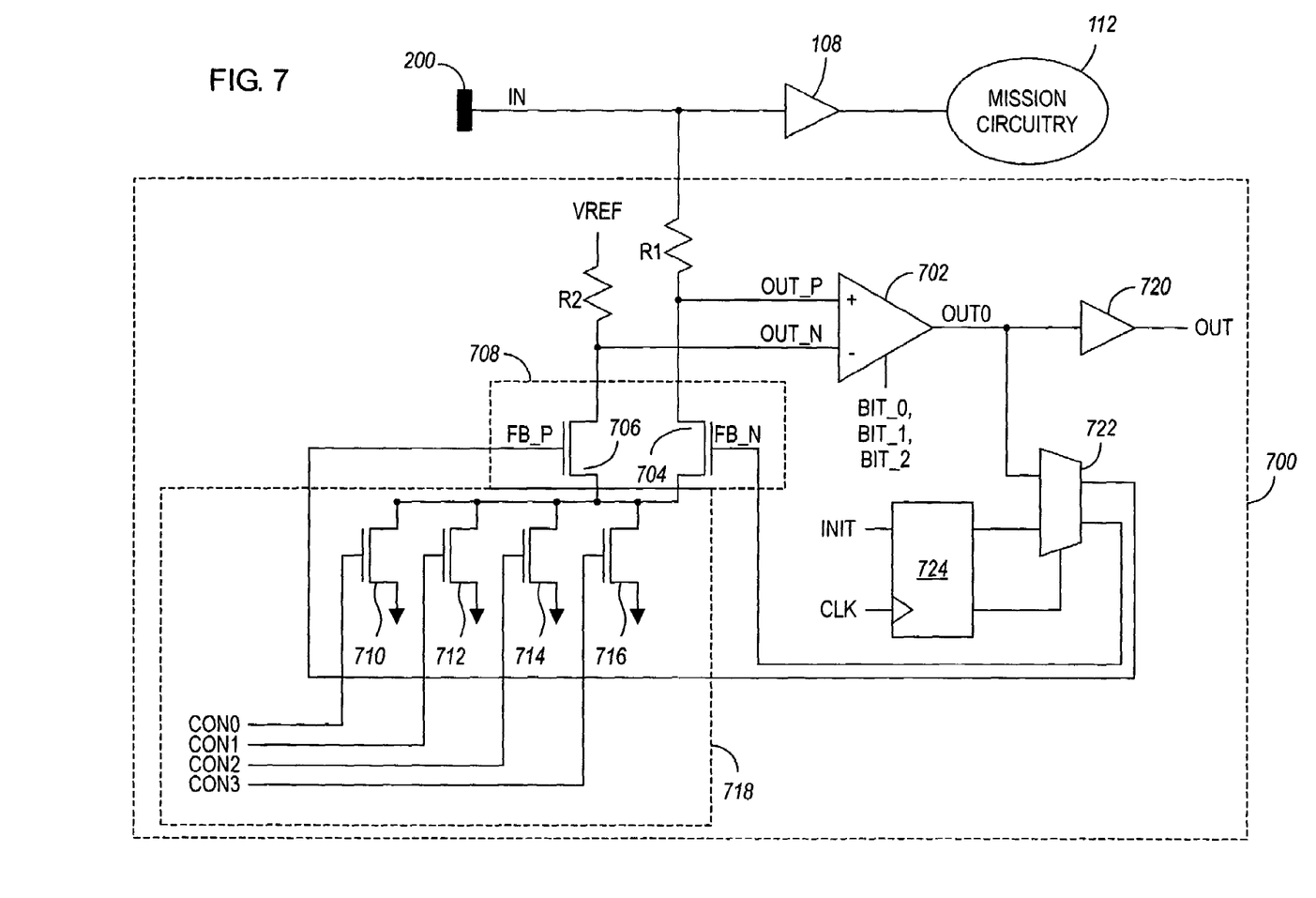
FIG. 7 illustrates an exemplary test receiver comprising programmable hysteresis voltage and hysteresis delay circuits.

FIG. 7 illustrates yet another Boundary-Scan test receiver 700 with programmable hysteresis circuits. In FIG. 7, however, the programmable hysteresis circuits comprise circuits for programming both a hysteresis voltage and a hysteresis delay.

Unlike the test receivers 320, 420, 520, 620 illustrated in FIGS. 3–7, the test receiver 700 illustrated in FIG. 7 comprises a single comparator 702 for detecting both leading and trailing edges of an incoming signal, IN. The comparator 702 receives the incoming signal, IN, through a resistor R2 and receives a reference voltage, $V_{REF}$, through a resistor R2. Resistors R1 and R2 are respectively coupled to the source terminals of a pair of transistors 704, 706 that serve as a hysteresis voltage switch 708. That is, the transistors 704, 706 are alternately driven to sink current from node OUT_P or node OUT_N, thereby generating a hysteresis voltage across resistor R1 or resistor R2. In this manner, a hysteresis voltage may be alternately switched between a comparator's inputs so that an expected leading edge of a signal will have to rise above a relatively high threshold to trigger the comparator 702, and an expected falling edge of a signal will have to fall below a relatively low threshold to trigger the comparator 702.

The drains of the transistors 704, 706 are coupled to ground via a plurality of transistors 710, 712, 714, 716. The gates of the transistors 710–716 are driven by a plurality of control signals (CON0, CON1, CON2, CON3) and thereby function as an IDAC 718 for controlling how much current is sunk from nodes OUT_P and OUT_N via the hysteresis voltage switch 708.

The output of the comparator 702 is provided to both a buffer 720 and one input of a multiplexer 722. From buffer 720, test data may be shifted out of the test receiver 700.

As already indicated, one input of the multiplexer 722 is coupled to receiver the output of the comparator 720. Another input of the multiplexer 722 is coupled to receive data from a flip-flop 724. The flip-flop 724, in turn, may receive data (INIT) shifted through a Boundary-Scan chain, and may provide a signal to the multiplexer 722 for selecting between the inputs of the multiplexer.

Each input of multiplexer 722 may receive a differential signal or, as shown, the multiplexer 722 may use single-ended inputs to produce a differential output, FB_P, FB_N. The differential output of the multiplexer 722 provides positive and negative feedback, FB_P, FB_N, to drive the transistors 704, 706 of the hysteresis voltage switch 708. Thus, if the output of the multiplexer 722 is derived from the output of the comparator 720, a hysteresis voltage is switched from the signal input to the reference input of the comparator 702 after a hysteresis delay. On the other hand, if the output of the multiplexer 722 is derived from the output of the flip-flop 724, the hysteresis voltage switch 708 may be initialized prior to the execution of a new Boundary-Scan test.

The hysteresis delay mentioned in the previous paragraph is equal to the sum of delays imparted by the comparator 702, the multiplexer 722, the hysteresis voltage switch 708, and the conductors connecting same. The length of this hysteresis delay determines how long an input signal must exceed the hysteresis voltage to register as valid. If the hysteresis delay is too short, errant spikes (noise) in input signal IN may inappropriately trigger the comparator 702. On the other hand, if the hysteresis delay is too long, valid transitions of input signal IN may decay before the comparator 702 has a chance to trigger. A programmable hysteresis delay would therefore be useful. A programmable hysteresis delay may be implemented in the FIG. 7 test receiver by incorporating a programmable hysteresis delay circuit such as the one shown in FIG. 8 or FIG. 9 into the feedback path of the test receiver 700. By way of example, the circuit 800 or 900 shown in FIG. 8 or FIG. 9 may be incorporated into the comparator 702 of the test receiver 700.

Figure 8:
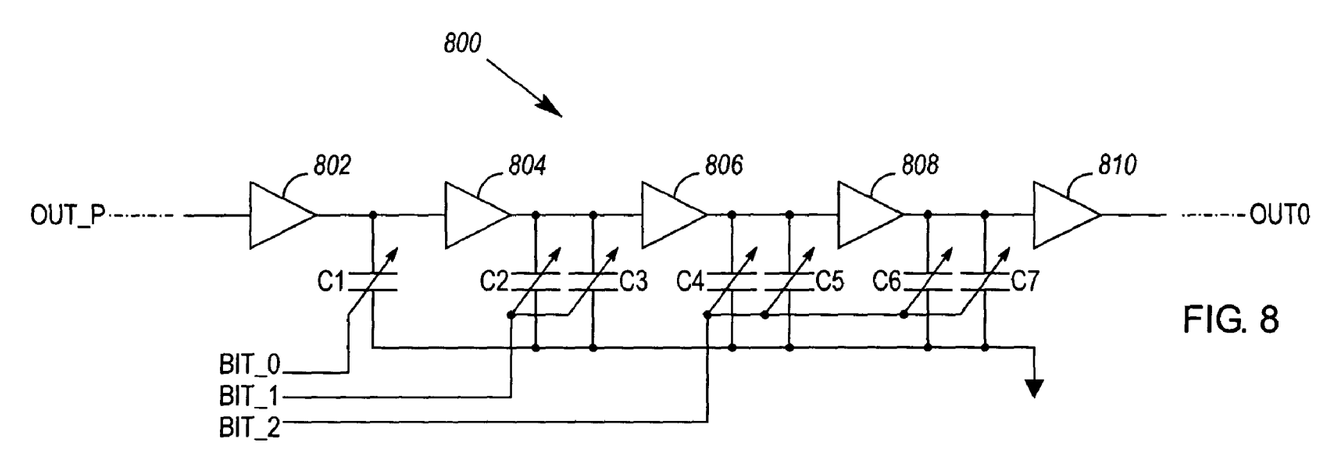
FIGS. 8 & 9 illustrate exemplary embodiments of the hysteresis delay circuits shown in FIG. 7.
Figure 9:
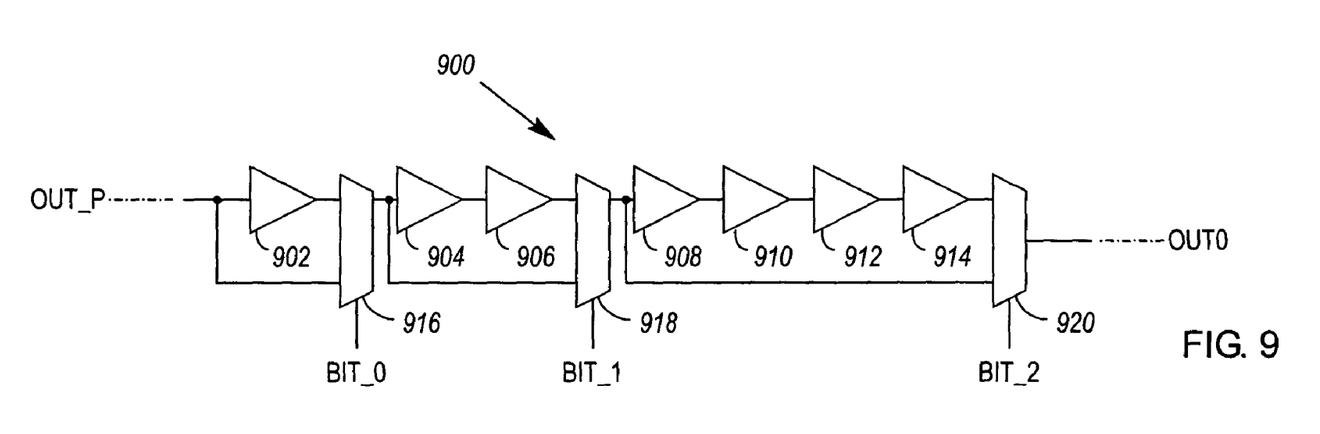

FIG. 8 illustrates a first exemplary embodiment of a programmable hysteresis delay circuit, in which a digital-to-analog converter 800 is formed by a plurality of bits {BIT_0, BIT_1, BIT_2} driving a plurality of variable capacitances C1–C7 that are coupled at various points along a chain of buffer elements 802, 804, 806, 808, 810. FIG. 9 illustrates an alternate embodiment of a programmable hysteresis delay circuit, in which a digital-to-analog converter 900 is formed by a plurality of bits {BIT_0, BIT_1, BIT_2} driving a chain of switchable delay elements 902, 904, 906, 908, 910, 912, 914 via a number of multiplexers 916, 918, 920. In this manner, a variety of combinations of delay elements 902–914 may be switched into a delay path. With reference to FIG. 7, the circuits 800, 900 shown in FIGS. 8 & 9 might be coupled into a path of the comparator 702, between its input node, OUT_P, and its output node, OUT0.

As shown in FIG. 3, the programmable inputs of any or all programmable hysteresis circuits 306 may be linked in a scan chain. In this manner, the hysteresis circuits 306 are programmed as test vectors are loaded into the components of a board under test. If desired, the programmable hysteresis circuits 306 may be linked into a Boundary-Scan chain as shown in FIG. 3, with the inputs to IDAC 300 being provided by one or more flip-flops 322 of a Boundary-Scan cell that are linked to other cells (e.g., 212, 118) in a Boundary-Scan chain. Alternately, programmable hysteresis circuits 306 could be linked in a scan chain that is separate from a component's Boundary-Scan chain. Further, the inputs of programmable hysteresis circuits 306 could be programmed individually, or in sets (e.g., a single set of bits could program a plurality of IDACs, or a single IDAC could program a plurality of test receivers).

Figure 10:
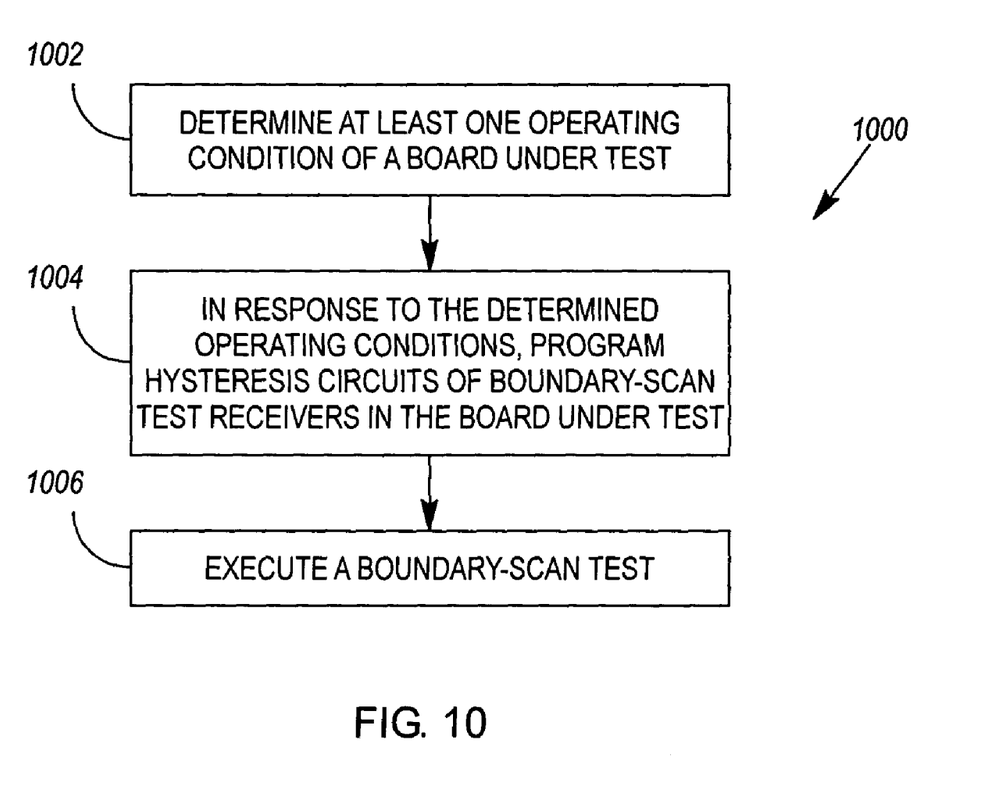
FIG. 10 illustrates an exemplary Boundary-Scan test method.

FIG. 10 illustrates an exemplary Boundary-Scan test method 1000. The method commences with a determination 1002 of one or more operating conditions of a board under test. By way of example, an operating condition might be a signaling level of a component of the board under test, or a noise level associated with signal paths of the board under test. The operating condition(s) may be determined via test, via automated or manual analysis of a board description, or by other means.

Following a determination of one or more board operating conditions, the hysteresis circuits of Boundary-Scan test receivers in the board under test are programmed in response to the board operating condition(s). This programming step may comprise programming hysteresis voltages, as well as hysteresis delays, and may include experimenting with programmed hysteresis levels (e.g., voltages and delays) until a test engineer is satisfied with the results he or she is receiving from Boundary-Scan tests. Programming may be accomplished by means of shifting bits through a scan chain.

The method set forth in FIG. 10 concludes with the execution of one or more Boundary-Scan tests.

In one variation on the FIG. 10 method, the programmable hysteresis circuits of Boundary-Scan test receivers are programmed with "default values" prior to determining one or more board operating condition(s). A Boundary-Scan test is then executed using the default values, and one or more operating conditions of the board under test, such as a noise level associated with various signal paths, is determined at least in part by evaluating the results of the Boundary-Scan test ran with the default values.

While illustrative and presently preferred embodiments of the invention have been described in detail herein, it is to be understood that the inventive concepts may be otherwise variously embodied and employed, and that the appended claims are intended to be construed to include such variations, except as limited by the prior art.

What is claimed is:

1. A Boundary-Scan test receiver for capturing signals during board interconnect testing, comprising:
    a) a comparator comprising a first input to receive said signals during board interconnect testing, a second input to receive a reference voltage, and an output; and
    b) a programmable hyteresis circuit coupled to at least one of said comparator inputs and the output, wherein a portion of the programmable hysteresis circuit coupled to the output is configured to receive multiple input control signals responsive to a condition on the board under test.

2. The Boundary-Scan test receiver of claim 1, wherein the programmable hysteresis circuit comprises a programmable hysteresis voltage generator.

3. The Boundary-Scan test receiver of claim 2, wherein the programmable hysteresis voltage generator comprises a current digital-to-analog converter to sink current from one of the said first and second inputs.

4. The Boundary-Scan test receiver of claim 1, wherein the programmable hysteresis circuit comprises a programmable hysteresis delay circuit.

5. The Boundary-Scan test receiver of claim 4, wherein the programmable hysteresis circuit delay circuit comprises a digital-to-analog converter driving a plurality of variable capacitances, the capacitances being coupled at various points along a chain of buffer elements.

6. The Boundary-Scan test receiver of claim 4, wherein the programmable hysteresis circuit delay circuit comprises a digital-to-analog converter driving a chain of switchable delay elements.

7. The Boundary-Scan test receiver of claim 1, wherein programmable inputs of the hysteresis circuit are linked in a scan chain.

8. The Boundary-Scan test receiver of claim 1, wherein the programmable hysteresis circuit receives a data input signal, a first control signal that determines an active path through the programmable hysteresis circuit, a second control signal that directs operation of a data capture device, and a third control signal that directs operation of an update device.

9. A Boundary-Scan test receiver for capturing signals during board interconnect testing, comprising:
    a) a plurality of comparators, each comprising a first input to receive said signals during board interconnect testing, a second input to receive a reference voltage and an output; and
    b) a programmable hysteresis circuit coupled to at least one input and the output of each comparator, wherein a portion of the programmable hysteresis circuit coupled to the output is configured to receive multiple input control signals responsive to a condition on the board under test.

10. The Boundary-Scan test receiver of claim 9, wherein the programmable hysteresis circuit comprises a programmable hysteresis voltage generator; the programmable hysteresis voltage generator comprising:
   a) a voltage divider, coupled between an input of each comparator;
   b) a current digital-to-analog converter driving the voltage divider; and
   c) a current mirror, coupled to a midpoint of the voltage divider to mirror a reference voltage at said midpoint.

11. The Boundary-Scan test receiver of claim 9, wherein the programmable hysteresis circuit comprises a programmable hysteresis voltage generator; the programmable hysteresis voltage generator comprising:
   a) a voltage divider, coupled between an input of each comparator;
   b) a current digital-to-analog converter driving the voltage divider; and
   c) a current mirror, coupled to a midpoint of the voltage divider to mirror a common mode voltage of said signals at said midpoint.

12. A Boundary-Scan test method, comprising:
   a) determining at least one operating condition of a board under test;
   b) in response to said at least one operating condition, programming hysteresis circuits of Boundary-Scan test receivers in the board under test, wherein programming comprises the application of at least one of a data input signal, a first control signal that determines an active path through the programmable hysteresis circuit, a second control signal that directs operation of a data capture device, and a third control signal that directs operation of an update device; and
   c) executing a Boundary-Scan test.

13. The BoundarScan test method of claim 12, wherein determining the at least one operating condition comprises determining a signaling level of a component of the board under test.

14. The Boundary-Scan test method of claim 12, wherein determining the at least one operating condition comprises determining a noise level associated with signal paths of the board under test.

15. The Boundary-Scan test method of claim 14, further comprising, prior to determining the at least one operating condition:
   a) programming hysteresis circuits of the Boundary-Scan test receivers with default values; and
   b) executing a Boundary-Scan test; wherein determining the noise level associated with signal paths of the board under test comprises evaluating results of the Boundary-Scan test ran with the default values.

16. The Boundary-Scan test method of claim 12, further comprising, prior to determining the at least one operating condition:
   a) programming hysteresis circuits of the Boundary-Scan test receivers with default values; and
   b) executing a Boundary-Scan test; wherein determining the at least one operating condition of the board under test comprises evaluating results of the Boundary-Scan test ran with the default values.

17. The Boundary-Scan test method of claim 12, wherein programming the hysteresis circuits comprises programming a hysteresis voltage.

18. The Boundary-Scan test method of claim 12, wherein programming the hysteresis circuits comprises programming a hysteresis delay.

19. The Boundary-Scan test method of claim 12, wherein the hysteresis circuits of a component of a board under test are programmed via bits shifted through a scan chain.

20. The Boundary-Scan test method of claim 12, wherein the hysteresis circuits of a component of a board under test are programmed in a plurality of sets.

* * * * *

UNITED STATES PATENT AND TRADEMARK OFFICE
CERTIFICATE OF CORRECTION

PATENT NO. : 7,222,278 B2
APPLICATION NO. : 10/666770
DATED : May 22, 2007
INVENTOR(S) : Charles Moore It is certified that error appears in the above-identified patent and that said Letters Patent is hereby corrected as shown below:

Col. 2 Line 4 Delete "fo" and insert -- for --, therefor.

Col. 8 Line 23 In Claim 1, delete "hyteresis" and insert -- hysteresis --, therefor.

Col. 8 Line 40 In Claim 5, after "hysteresis" delete "circuit".

Col. 8 Line 45(Approx.) In Claim 6, after "hysteresis" delete "circuit".

Col. 9 Line 38 In Claim 13, delete "BoundarScan" and insert -- Boundary-Scan --, therefor.

Col. 10 Line 34 In Claim 19, before "board" delete "a" and insert -- the --, therefor.

Col. 10 Line 36(Approx.) In Claim 20, delete "claim 12," and insert -- claim 19, --, therefor.

Col. 10 Line 37(Approx.) In Claim 20, before "board" delete "a" and insert -- the --, therefor.

Signed and Sealed this

Sixteenth Day of December, 2008

JON W. DUDAS
*Director of the United States Patent and Trademark Office*